United States Patent
Ahn et al.

(10) Patent No.: US 6,813,175 B2
(45) Date of Patent: Nov. 2, 2004

(54) INTERCONNECTION LAYOUT OF A SEMICONDUCTOR MEMORY DEVICE

(75) Inventors: Hyo-Joo Ahn, Seoul (KR); Byong-Mo Moon, Seoul (KR); Hyun-Kyoung Kim, Yongin-Shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/253,926

(22) Filed: Sep. 25, 2002

(65) Prior Publication Data

US 2003/0058677 A1 Mar. 27, 2003

(30) Foreign Application Priority Data

Sep. 26, 2001 (KR) ........................................ 2001-59573

(51) Int. Cl.$^7$ ................................................. G11C 5/06
(52) U.S. Cl. ................ 365/63; 365/189.02; 365/189.12
(58) Field of Search ............................. 365/63, 189.02, 365/189.12

(56) References Cited

U.S. PATENT DOCUMENTS

| 5,493,526 | A | * | 2/1996 | Turner et al. | 365/185.33 |
| 5,646,893 | A | * | 7/1997 | McMinn et al. | 365/189.05 |
| 5,894,437 | A | * | 4/1999 | Chang et al. | 365/185.13 |
| 6,275,407 | B1 | * | 8/2001 | Otsuka | 365/63 |

FOREIGN PATENT DOCUMENTS

JP    2000-029923    1/2000

* cited by examiner

*Primary Examiner*—Huan Hoang
(74) *Attorney, Agent, or Firm*—Volentine Francos & Whitt, PLLC

(57) ABSTRACT

An interconnection layout includes alternately arranged data-read lines and data-write lines. The data-write lines are maintained at a ground voltage level when the data-read lines in a transitional state, and the data-read lines are maintained at the ground voltage level when the data-write lines in a transitional state. Therefore, a coupling capacitance is not produced between adjacent data-write lines and adjacent data-read lines.

5 Claims, 4 Drawing Sheets

INTERCONNECTION LAYOUT OF A SEMICONDUCTOR MEMORY DEVICE

BACKGROUND OF THE INVENTION

1. Field of the Invention

The present invention relates to a semiconductor integrated circuit and, more particularly, to an interconnection layout of a semiconductor integrated circuit which eliminates or reduces errors that result from a capacitive coupling between data transfer interconnection lines.

A claim of priority is made to Korean Patent Application No. 2001-59573, filed Sep. 26, 2001, the contents of which are incorporated by reference in their entirety.

2. Description of the Related Art

A plurality of interconnections such as a signal line, a power interconnection, a ground interconnection, and the like are formed on a substrate of a semiconductor integrated circuit. These interconnections exhibit an electrical resistance (or interconnection resistance). Also, an interconnection capacitance is present between each interconnection and the substrate, and between each interconnection and an adjacent interconnection. When a signal is transferred through a signal line, a signal delay occurs which is dependent upon the product of the interconnection resistance of the signal line and the interconnection capacitance thereof. As such, the signal delay is largely influenced by the magnitude of the interconnection capacitance.

The interconnection capacitance is generally equal to the sum of a capacitance between a top side or a bottom side of an interconnection and a substrate (side element capacitance), a capacitance between a lateral side of the interconnection and the substrate (fringe capacitance), and a capacitance between adjacent interconnections (coupling capacitance).

Prior to the introduction of micron-sized semiconductor integrated circuits, the interconnection-substrate capacitances (side element and fringe capacitances) were more significant than the coupling capacitance. In recent years, however, as semiconductor integrated circuits have been continuously scaled down, the upper and lower areas of the interconnections have been reduced in size. On the other hand, the interconnection spacing has become narrower. Therefore, the coupling capacitance has increased in significance, to the point now where the coupling capacitance accounts for 50% or more of the total interconnection capacitance.

Also, since a substrate potential is generally fixed in the interconnection-substrate capacitance, it is unnecessary to consider the change in the substrate potential when calculating a degree of signal delay caused by the interconnection capacitance. On the other hand, the potential of a signal line transitions between different values according to the state of the transferred signal. The transition of the signal line potential leads to a change in the degree of signal delay caused by the coupling capacitance between the signal lines. When the potentials of two adjacent signal lines transition between high and low voltages at a same timing, or transition between high and low voltages at opposite timings, the degree of signal delay caused by the coupling capacitance changes. The resultant variability in signal delay makes circuit design difficult.

FIG. 1 shows an interconnection layout of a semiconductor memory device that has separate data-write lines and data-read lines.

Referring to FIG. 1, data inputted through data input terminals (not shown) is provided to a memory cell array (not shown) through data-write lines WL0 and WL1. Data read out from the memory cell array is outputted to data output terminals (not shown) through data-read lines RL0 and RL1. In a conventional interconnection layout, the data-write lines WL0 and WL1 are disposed to be adjacent to each other and the data-read lines RL0 and RL1 are disposed to be adjacent to each other. Accordingly, a coupling capacitance Cc is produced between the data-write lines WL0 and WL1 when the data is inputted through the data input terminals, and a coupling capacitance Cc is produced between the data-write lines RL0 and RL1 when the data read out from the memory cell array is loaded on the data-read lines RL0 and RL1.

The coupling capacitances Cc between interconnections distorts and/or variably delays the data, inhibiting an effective operation of the semiconductor memory device.

SUMMARY OF THE INVENTION

The present invention provides an interconnection layout which reduces the adverse effects of a coupling capacitance between interconnections in a semiconductor integrated circuit.

According to an aspect of the present invention, a semiconductor memory device includes a first group of first interconnection lines and a second group of second interconnection lines. The first interconnection lines and the second interconnection lines are alternately arranged one by one. In a preferred embodiment, the interconnection lines belonging to the first group are driven to a power supply voltage level when the interconnection lines belonging to the second group are held in a ground state, and the interconnection lines belonging to the second group are driven to the power supply voltage when the interconnection lines belonging to the first group are held in the ground state.

Also, in the preferred embodiment, signals transferred onto the interconnection lines belonging to the first group transition between voltage levels at different timings. Likewise, in the preferred embodiment, the signals transferred onto the interconnection lines belonging to the second group transition between voltage levels at different timings.

Further, in the preferred embodiment, the interconnection lines belonging to the first group are data write lines for transferring externally inputted data to the semiconductor memory device. Likewise, in the preferred embodiment, the interconnection lines belonging to the second group are data read lines for transferring data from the semiconductor memory device to the exterior of the semiconductor memory device.

BRIEF DESCRIPTION OF THE DRAWINGS

The features and advantages of the present invention will become readily apparent from the detailed description that follows, with reference to the accompanying drawings, in which.

DETAILED DESCRIPTION OF THE PREFERRED EMBODIMENTS

In the interconnection layout of a semiconductor memory device according to the present invention, data-read lines and data-write lines are alternately arranged. When signals of the data-read lines transition between voltage levels, the data-write lines are maintained at a ground voltage level. When signals of the data-write lines transition between voltage levels, the data-read lines are maintained at the ground voltage level. In this manner, a coupling capacitance between data transferring lines is not produced.

Figure 1:
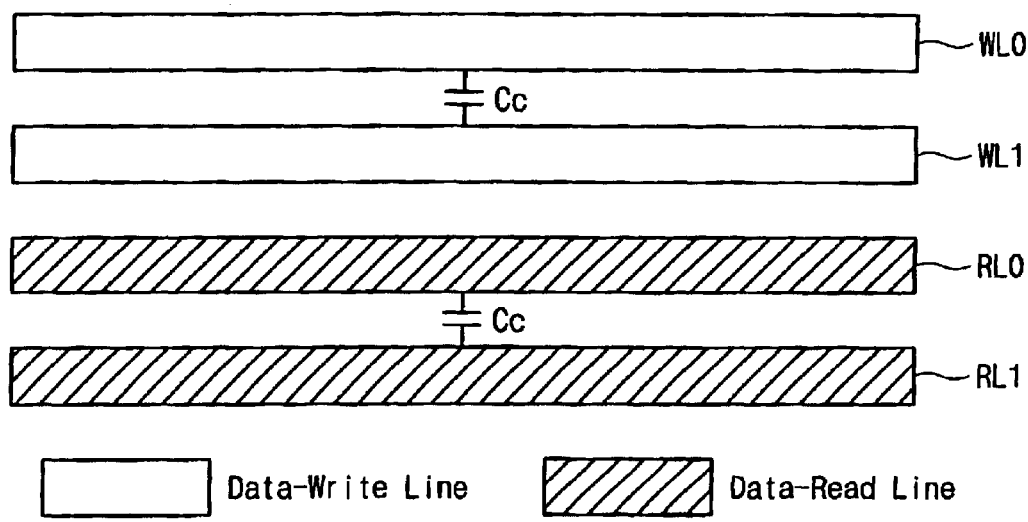
FIG. 1 shows an interconnection layout of a semiconductor memory device that separately has data-write lines and data-read lines.
Figure 2:
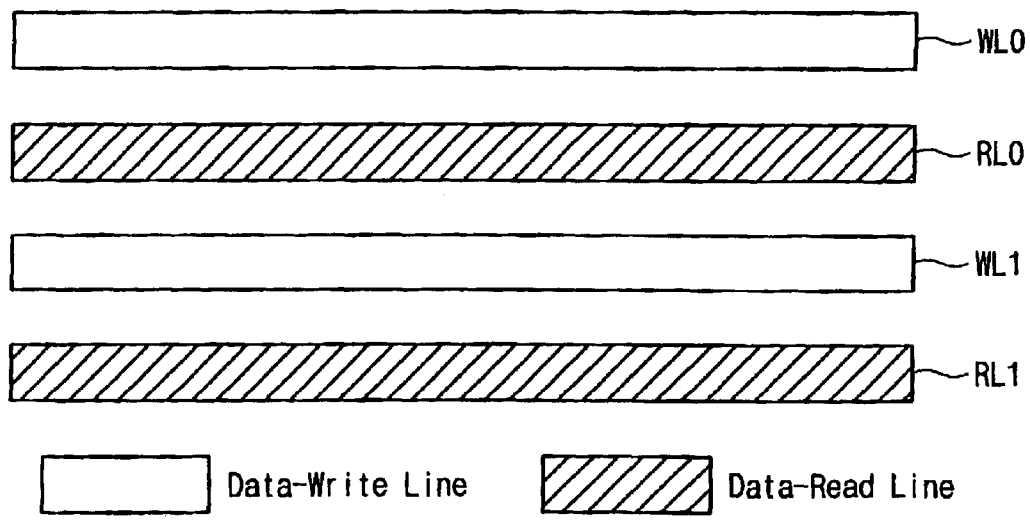
FIG. 2 shows an interconnection layout in a semiconductor memory device according to a preferred embodiment of the present invention.

Referring to FIG. 2, data-write lines WL0 and WL1 and data-read lines RL0 and RL1 are alternately arranged. The data-write lines WL0 and WL1 transfer data inputted through data input terminals (not shown) to a memory cell array (not shown). The data-read lines RL0 and RL1 transfer data read out from the memory cell array to output terminals (not shown). Although only two data-write lines WL0 and WL1 and two data-read lines RL0 and RL1 are illustrated in the FIG. 2, the number of each type of line may be changed as the memory design dictates.

Figure 3:
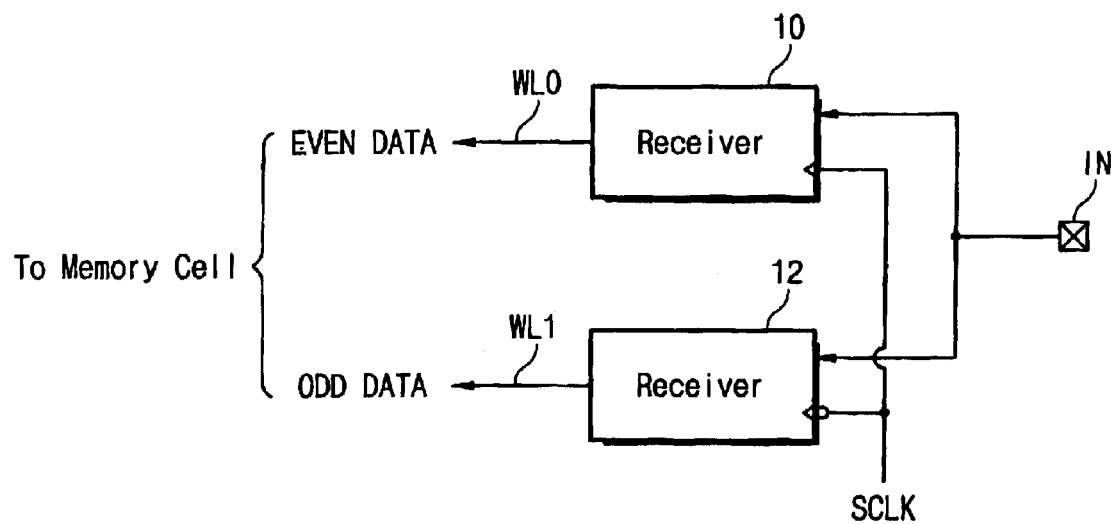
FIG. 3 shows a circuit for driving data-write lines shown in FIG. 2.

Referring to FIG. 3, a data-write line driver circuit includes receivers 10 and 12. The receiver 10 transfers data inputted from an input terminal IN to a data-write line WL0 in response to a clock signal SCLK. The receiver 12 transfers data inputted from the input terminal IN to a data-write line WL1 in response to an inverted version of the clock signal SCLK.

Figure 4:
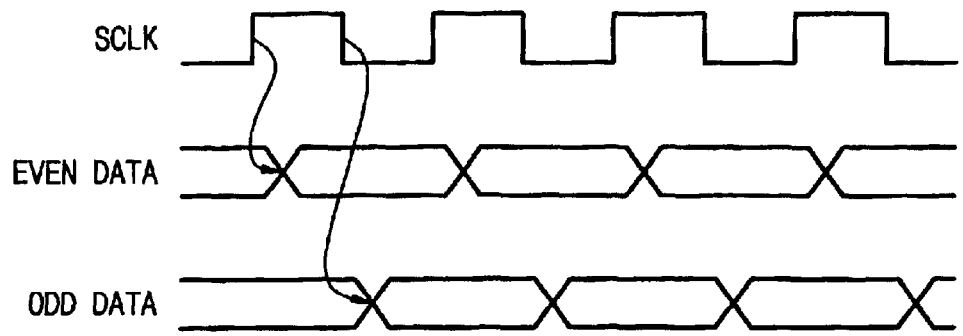
FIG. 4 is a timing diagram for explaining operations of receivers shown in FIG. 3.

Referring to FIG. 4, the receiver 10 transfers data inputted from the input terminal IN, as even-numbered data EVEN DATA, to the data line WL0 at a rising edge of the clock signal SCLK, i.e., at a low-to-high transition of the clock signal SCLK. The receiver 12 transfers the data inputted from the input terminal IN, as odd-numbered data ODD DATA, to the data line WL1 at a falling edge of the clock signal SCLK, i.e., at a high-to-low transition of the clock signal SCLK.

Figure 5:
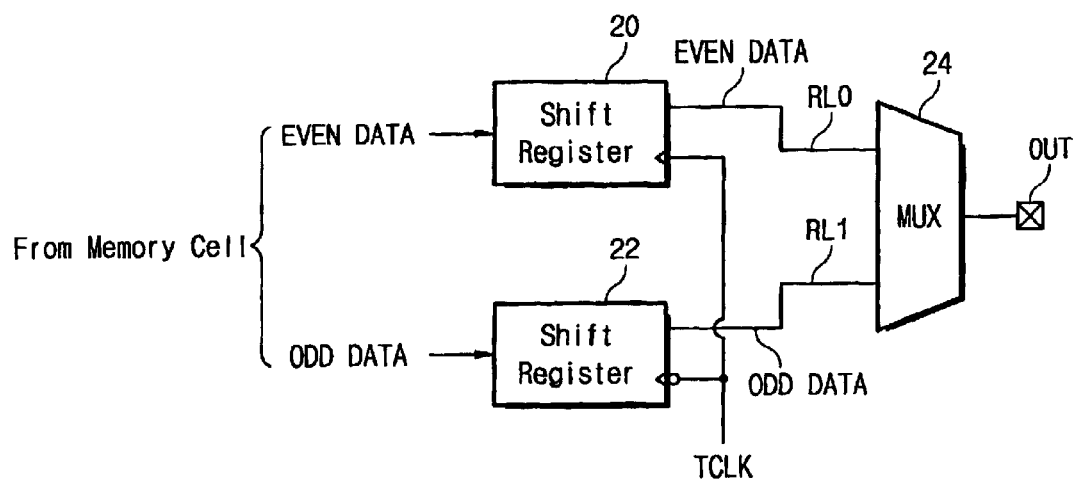
FIG. 5 shows a circuit for transferring data loaded on the data-read lines of FIG. 2 to an output terminal.

Referring to FIG. 5, a data output circuit includes shift registers 20 and 22 and a multiplexer 24. The shift register 20 transfers data read out from a memory cell to one input terminal of the multiplexer 24 through the data-read line RL0 in response to a clock signal TCLK. The shift register 22 transfers data read out from the memory cell to the multiplexer 24 through the data-read line RL1 in response to an inverted version of the clock signal TCLK. The multiplexer 24 sequentially outputs data inputted from the shift register 20 to an output terminal OUT in response to the clock signal TCLK.

Figure 6:
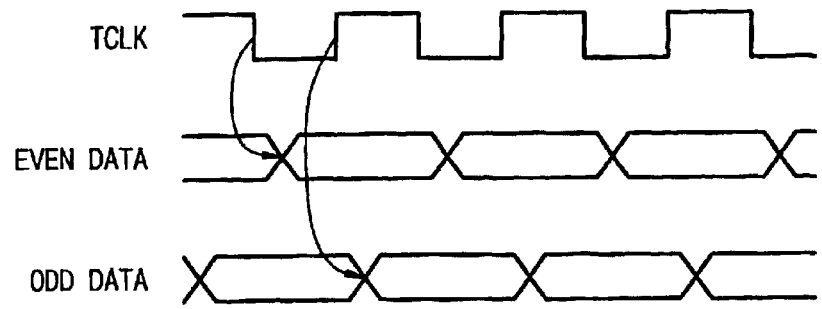
FIG. 6 is a timing diagram for explaining operations of a data output circuit shown in FIG. 5.

Referring to FIG. 6, the multiplexer 24 selects even-numbered data EVEN DATA outputted from the shift register 20 and transfers the selected even-numbered data EVEN DATA to the output terminal OUT, at a falling edge of the clock signal TCLK. Also, the multiplexer 24 selects odd-numbered data ODD DATA outputted from the shift register 22 and outputs the selected odd-numbered data ODD DATA, at a rising edge of the clock signal TCLK.

Figure 7:
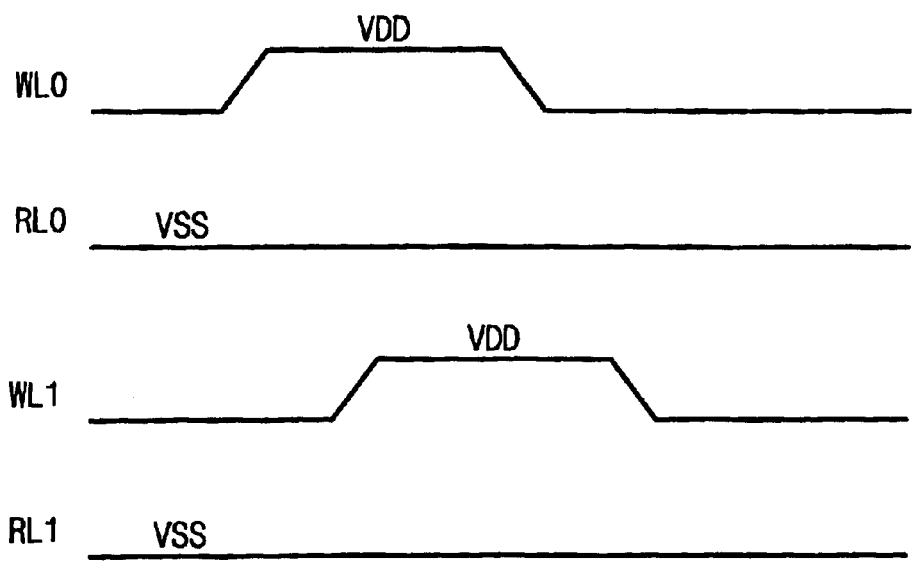
FIG. 7 shows transition states of data lines when data is inputted through an input terminal shown in FIG. 3.

Referring to FIG. 7, when binary data (i.e., logic "1") of power supply voltage level VDD is inputted through the input terminal IN at the rising edge of the clock signal SCLK, the data-write line WL0 goes to the power supply voltage level. Afterwards, when the binary data (i.e., logic "1") of the power supply voltage level is inputted through the input terminal IN at the falling edge of the clock signal SCLK, the data-write line WL1 goes to the power supply voltage level VDD. In this case, a coupling capacitance is not produced between the data-write transfer lines because each of the data-read lines RL0 and RL1 is maintained at a ground voltage level VSS.

Figure 8:
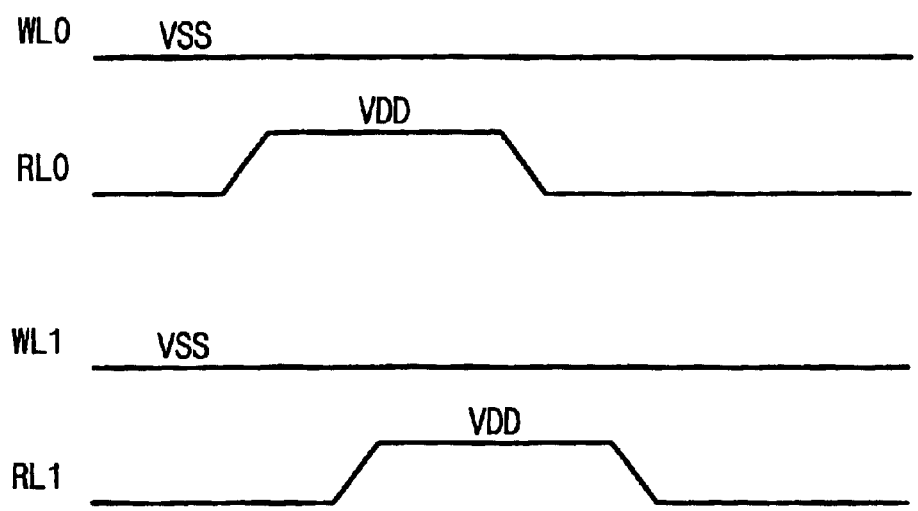
FIG. 8 shows transition states of data lines when data is outputted through an output terminal shown in FIG. 5.

Referring to FIG. 8, when data EVEN DATA read out from the memory cell is logic "1" at the falling edge of the clock signal TCLK, the data-read line RL0 goes to the power supply voltage level VDD. Meanwhile, when data ODD DATA read out from the memory cell is logic "1" at the rising edge of the clock signal TCLK, the data-read line RL1 goes to the power supply voltage level VDD. Since the data-write lines WL0 and WL1 are maintained at a ground voltage level VSS when the data-read lines RL0 and RL1 are in the power supply voltage level VDD, a coupling capacitance is not produced between the data-read lines.

The present invention is not limited to the specific embodiment described herein, and persons skilled in the art will recognize that many variations of the teachings of this invention can be practiced that still fall within the scope of the claims which follow.

What is claimed is:

1. An interconnection layout for a semiconductor memory device, comprising:

a first group of first interconnection lines for transmitting respective plural first signals, each of the plural first signals transitioning between first and second voltage levels; and a second group of second interconnection lines for transmitting respective plural second signals, each of the plural second signals transitioning between the first and second voltage levels, wherein the first interconnection lines and the second interconnection lines are alternately arranged one by one; and wherein the second interconnection lines remain at the first voltage level when the respective plural first signals are transmitted on the first interconnection lines, and wherein the first interconnection lines remain at the first voltage level when the respective plural second signals are transmitted on the second interconnection lines;

wherein the respective plural first signals are transmitted on the first interconnection lines at different timings;

wherein the plural first signals include a first data write signal and a second data write signal, and wherein the interconnection layout further comprises (a) a first receiver which receives a common input data write signal and which outputs the first data write signal to a first one of the first interconnection lines, and (b) a second receiver which receives the common input data write signal and which outputs the second data write signal to a second one of the first interconnection lines; and wherein the first receiver outputs the first data write signal in response to a clock signal, and the second receiver outputs the second data write signal in response to an inverted signal of the clock signal.

2. The interconnection layout of claim 1, wherein the first voltage level is a ground voltage VSS.

3. The interconnection layout of claim 2, wherein the second voltage level is a power supply voltage level VDD.

4. An interconnection layout for a semiconductor memory device, comprising:

a first group of first interconnection lines for transmitting respective plural first signals, each of the plural first signals transitioning between first and second voltage levels; and a second group of second interconnection lines for transmitting respective plural second signals, each of the plural second signals transitioning between first and second voltage levels, wherein the first interconnection lines and the second interconnection lines are alternately arranged one by one;

wherein the second interconnection lines remain at the first voltage level when the respective plural first signals are transmitted on the first interconnection lines, and wherein the first interconnection lines remain at the first voltage level when the respective plural second signals are transmitted on the second interconnection lines;

wherein the respective plural first signals are transmitted on the first interconnection lines at different timings;

wherein the plural second signals include a first data read signal and a second data read signal, and wherein the interconnection layout further comprises:

a first shift register which receives and outputs the first data read signal from a first one of the second interconnection lines;

a second shift register which receives and outputs the second data read signal from a second one of the second signal lines; and a multiplexer which multiplexes the first and second data read signals output from the first and second shift registers.

5. The interconnection layer of claim 4, wherein the first shift register outputs the first data read signal in response to a clock signal, and the second shift register outputs the second data read signal in response to an inverted signal of the clock signal.

* * * * *